(12) United States Patent
Ma et al.

(10) Patent No.: US 9,356,258 B2
(45) Date of Patent: *May 31, 2016

(54) OLEDS AND OTHER ELECTRONIC DEVICES USING DESICCANTS

(71) Applicant: Universal Display Corporation, Ewing, NJ (US)

(72) Inventors: Ruiqing Ma, Morristown, NJ (US); Jeffrey A. Silvernail, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 162 days.

This patent is subject to a terminal disclaimer.

(21) Appl. No.: 13/869,118

(22) Filed: Apr. 24, 2013

(65) Prior Publication Data

US 2014/0061608 A1    Mar. 6, 2014

Related U.S. Application Data (62) Division of application No. 12/999,187, filed as application No. PCT/US2009/049691 on Jul. 6, 2009, now Pat. No. 8,466,476.

(60) Provisional application No. 61/078,633, filed on Jul. 7, 2008.

(51) Int. Cl.
*H01L 51/52* (2006.01)

(52) U.S. Cl.
CPC ........ *H01L 51/5259* (2013.01); *H01L 51/5237* (2013.01)

(58) Field of Classification Search
CPC .................. H01L 51/5237; H01L 51/5259
USPC ......................................................... 257/682
See application file for complete search history.

(56) References Cited

U.S. PATENT DOCUMENTS

| | | | |
|---|---|---|---|
| 6,833,668 B1 * | 12/2004 | Yamada | H01L 51/5237 313/505 |
| 6,888,307 B2 | 5/2005 | Silvernail et al. | |
| 7,316,756 B2 | 1/2008 | Boroson | |
| 8,466,476 B2 * | 6/2013 | Ma | H01L 51/5237 257/100 |
| 2003/0190763 A1 | 10/2003 | Cok et al. | |
| 2004/0191568 A1 * | 9/2004 | Ohshita | H01L 51/5237 428/690 |
| 2005/0046349 A1 | 3/2005 | Tanaka et al. | |

(Continued)

FOREIGN PATENT DOCUMENTS

WO    2010011390    1/2010

OTHER PUBLICATIONS

PCT International Search Report for PCT/US2009/049691, mailed on Oct. 5, 2009.

(Continued)

*Primary Examiner* — Jerome Jackson, Jr.
*Assistant Examiner* — Charles R Peters
(74) *Attorney, Agent, or Firm* — Duane Morris LLP (57) ABSTRACT

Electronic devices that use desiccants for protection from moisture. The electronic devices comprise a substrate and an organic element disposed over the top surface of the substrate. The substrate has one or more voids which may store desiccants. The voids may penetrate partially or completely through the thickness of the substrate. An environmental barrier is disposed over the organic element and the voids. Also provided are methods for making electronic devices that use desiccants.

23 Claims, 5 Drawing Sheets

(56) References Cited

U.S. PATENT DOCUMENTS

| | | |
|---|---|---|
| 2005/0179378 A1 | 8/2005 | Ooka et al. |
| 2006/0022592 A1* | 2/2006 | Boroson ............... H01L 51/524 313/512 |
| 2007/0131944 A1 | 6/2007 | Hu et al. |
| 2008/0237181 A1 | 10/2008 | Wagner et al. |
| 2010/0041298 A1 | 2/2010 | Lee et al. |
| 2010/0148160 A1 | 6/2010 | Cao |

OTHER PUBLICATIONS

Mandlik et al., 2008, "Diffusion of atmospheric gases into barrier-layer sealed organic light emitting diodes", Appl. Phys. Lett. 93:203306-1-3.

* cited by examiner

178 defects

OLEDS AND OTHER ELECTRONIC DEVICES USING DESICCANTS

RELATED APPLICATIONS

This application is a divisional of U.S. patent application Ser. No. 12/999,187, filed Dec. 15, 2010, which is a U.S. national stage application under 35 U.S.C. 371 of PCT/US2009/049691, filed Jul. 6, 2009, which claims priority to U.S. Provisional Application No. 61/078,633 filed 7 Jul. 2008, both of which are expressly incorporated by reference thereto.

RESEARCH AGREEMENTS

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

TECHNICAL FIELD

The present invention relates to protecting electronic devices, such as organic light-emitting devices, from moisture by using desiccants.

BACKGROUND

Organic electronic devices, such as organic light-emitting devices (OLEDs), are susceptible to degradation when exposed to environmental contaminants, such as water vapor or oxygen. For example, exposure to moisture and/or oxygen can cause degradation of the light-emitting material, cause "dark spots" or pixel shrinkage, or reduce the useful lifetime of the OLED. To address this problem, OLED displays are commonly fabricated on thick, rigid glass substrates with a glass or metal cover sealed at the edges to enclose the light-emitting element. To provide further protection, it is conventional to also place a desiccant inside the sealed compartment enclosing the light-emitting element. However, this desiccant arrangement is not suitable for many types of flexible OLEDs where a flexible thin-film barrier is used to encapsulate the device. Thus, there is a need for improved means to protect electronic devices, such as OLEDs, from environmental contaminants.

SUMMARY

In one aspect, the present invention provides an electronic device comprising: a substrate having a void, wherein the substrate has a top surface on one side and a bottom surface on the opposite side; a desiccant disposed in the void in the substrate; an organic element disposed over the top surface of the substrate; and an environmental barrier disposed over the organic element, wherein the environmental barrier covers over the void in the substrate.

In another aspect, the present invention provides a method for making an electronic device, comprising: providing a substrate; creating a void in the substrate; disposing a desiccant in the void; disposing an organic element over the substrate; and disposing an environmental barrier over the organic element and over the void in the substrate.

In another aspect, the present invention provides an electronic device comprising: a substrate having a void through the thickness of the substrate, the substrate having a top surface on one side and a bottom surface on the opposite side; an organic element disposed over the top surface of the substrate; an environmental barrier that conformally encapsulates the organic element, wherein the environmental barrier is in contact with the substrate and seals over the void; an enclosed bottom chamber over the bottom surface of the substrate, the bottom chamber being in communication with the void; and a desiccant contained in the bottom chamber.

BRIEF DESCRIPTION OF THE DRAWINGS

FIGS. 1A and 1B show an OLED according to an embodiment of the present invention.

DETAILED DESCRIPTION

The present invention provides electronic devices that use desiccants for protection from moisture. The electronic device comprises a substrate and an organic element disposed over the top surface of the substrate. An environmental barrier is disposed over the organic element.

Some of the characteristics of the substrate will vary depending upon the particular application. Such characteristics include the transparency (or opacity), flexibility (or rigidity), or permeability of the substrate. The substrate can be formed of any suitable material known to be used in substrates for electronic devices (e.g., metals, glass, polymers, semiconductors, ceramics, etc.), as selected according to the desired characteristics.

The organic element serves as the active portion (e.g., light-emitting or light-absorbing) of the electronic device. Such organic elements may have any of various architectures used for organic electronic devices. For example, many OLEDs are formed of a stack of organic films between two electrodes.

The organic element is protected from environmental contaminants (e.g., moisture and/or oxygen) by an environmental barrier that is disposed over the organic element. The environmental barrier may be any type of structure (e.g., covers, plates, films, layers, sheets, etc.) suitable for protecting the electronic device from environmental contaminants. Some of the characteristics of the environmental barrier will vary depending upon the particular application. Such characteristics include the transparency (or opacity), flexibility (or rigidity), or thickness of the environmental barrier. These characteristics can be determined by various factors, including the material composition or dimensions (e.g., thickness) of the environmental barrier.

The environmental barrier can be formed of any suitable material, including inorganic materials, such as metal oxides, metal nitrides, metal carbides, or metal oxynitrides. Other inorganic materials include silicon oxides, silicon nitrides, silicon oxynitrides, aluminum oxides, indium-tin oxides, and zinc indium tin oxides. The environmental barrier may also be made of organic polymers such as parylene, polyesters, polyimides, polyethersulphones, etc. The environmental barrier may also be made of ceramics, including glasses such as borosilicate glass or soda lime.

Where the environmental barrier is a rigid cover (e.g., glass), the cover may be adhered to the substrate by using any suitable adhesive material or other bonding technique. Where the environmental barrier is a thin film encapsulating the organic element, the film may be deposited by any suitable deposition technique, including physical vapor deposition, chemical vapor deposition, plasma-enhanced chemical vapor deposition, spin coating, etc. Such films may be single-layered or multi-layered films. In some cases, the film may be any of the hybrid layers disclosed in U.S. Patent Application Publication No. 2008/0102223 (for application Ser. No. 11/783,361 entitled "Hybrid Layers for Use in Coatings on Electronic Devices or Other Articles" filed on 9 Apr. 2007) or any of the multilayered coatings disclosed in U.S. Patent Application Publication No. 2008/0102206 (for application Ser. No. 11/783,362 entitled "Multilayered Coatings for Use on Electronic Devices or Other Articles" filed 9 Apr. 2007), both of which are incorporated by reference herein in their entirety.

The substrate has one or more voids. In certain embodiments, desiccants are stored in the void(s). By this arrangement, moisture that penetrates through or around the environmental barrier can be absorbed by the desiccant contained in the voids. One of the problems with the use of desiccants in moisture-sensitive electronic devices is that the footprint size of the devices may need to be increased in order to accommodate the desiccants. Thus, storing the desiccant within the substrate in this manner can be useful in avoiding the need to increase the footprint size of the device to accommodate the desiccants.

The voids can have any of various shapes or geometries, and as such, the voids may be holes, openings, slots, grooves, channels, etchings, scribe lines, perforations, pits, etc. The voids may penetrate partially or completely through the thickness of the substrate. The voids may be created by any suitable excavation technique, including direct-write etching using energetic beams (e.g., laser, ion, or electron), micromachining, microdrilling, or lithographic processes.

The voids are located at the periphery of the organic element. Further, the voids are covered by the environmental barrier. The shape of the voids will vary depending upon the particular application (e.g., round, square, rectangular, etc). The size of the voids will vary depending upon the particular application, and in some cases, the size of the voids are in the range of 50 nm to 500 µm (as measured along its longest axis).

In embodiments where the electronic device is an active-matrix OLED having an array of the organic elements serving as active pixels, the voids may be located at positions that substantially avoid obstructing the transmission of light from the active pixels. For example, the voids may be located between the active pixels.

In certain embodiments, the voids may be openings through the full thickness of the substrate. In some of such embodiments, the electronic device may further include a compartment on the bottom side of the substrate for containing additional desiccant. This compartment is in communication with the openings, and thus, the additional desiccant provides additional moisture-absorbing capacity. This feature may be useful where the electronic device is a top-emitting OLEDs (where light emission is primarily directed away from the substrate) because the additional desiccant can be placed in the bottom compartment without concern about obstructing the top-directed transmission of light from the light-emitting organic element. Thus, in addition to allowing for reduced footprint size (as mentioned above), the placement of desiccants in this manner may further be useful in allowing greater desiccant capacity without obstructing light transmission.

The material used for the desiccant can be any moisture-absorbing material that is suitable for use in electronic devices, including the Group 2A metals (e.g., calcium or barium) and their oxides (e.g., calcium oxide or barium oxide).

In certain embodiments, the substrate and/or the environmental barrier is flexible. In such cases, lateral ingress of moisture through the sides of the electronic device can be a significant problem, particularly during flexion of the electronic device. As such, this arrangement of the desiccant can be useful in impeding the lateral ingress of moisture around the environmental barrier.

The electronic device may be any of various types of organic electronic devices, including organic light-emitting devices, organic field-effect transistors, organic photovoltaic cells, and organic photodetectors. Electronic devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18°-30° C., and more preferably at room temperature (20°-25° C.).

Figure 1A:
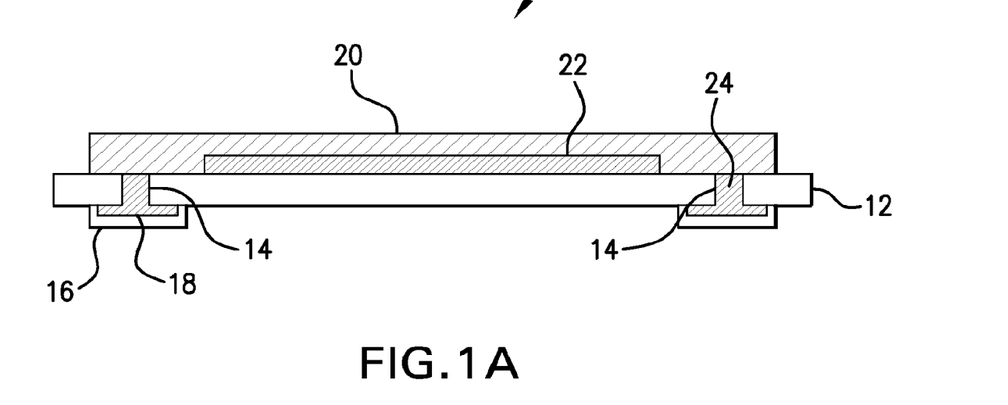
FIG. 1A shows a cross-section side view of the OLED.
Figure 1B:
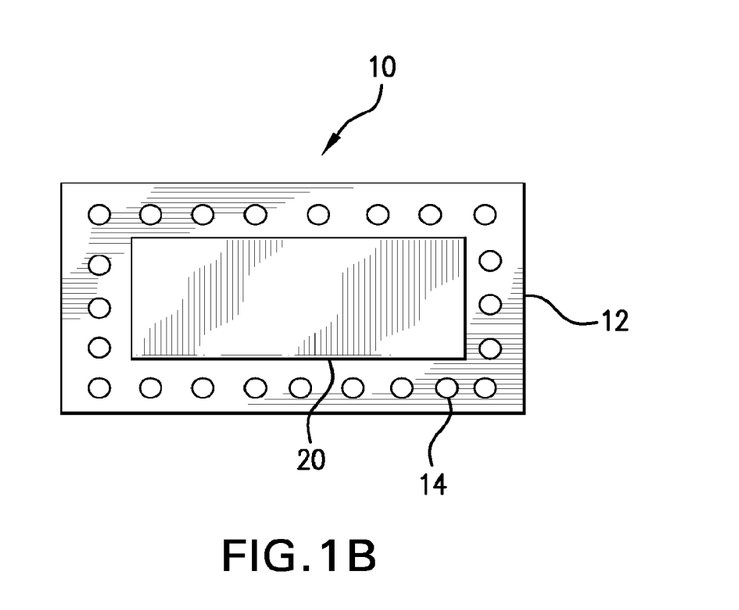
FIG. 1B shows a top view of the OLED.

Referring to the embodiment shown in FIGS. 1A and 1B, a top-emitting OLED 10 comprises a metal foil substrate 12 having a plurality of openings 14 formed through the thickness of substrate 12. An organic light-emitting element 22 is mounted on the top surface of substrate 12. Light-emitting element 22 comprises a stack of organic films between two electrodes (as conventional in many OLED architectures). Light-emitting element 22 is covered with a transparent barrier film 20 that extends over the edges of and encapsulates light-emitting element 22. Barrier film 20 is resistant to the penetration of environmental contaminants, and thereby, serves to protect light-emitting element 22. Barrier film 20 also covers over openings 14.

FIG. 1B shows a top view of OLED 10 (barrier film 20 not shown). As seen in this view, light-emitting element 22 is surrounded on its periphery by openings 14. Referring back to FIG. 1A, openings 14 are filled with a desiccant 24. Openings 14 may be created and/or filled with desiccant 24 before or after light-emitting element 22 and/or barrier film 20 are provided. By this arrangement, moisture that penetrates by lateral ingress between barrier film 20 and substrate 12 can be absorbed by desiccant 24 contained in openings 14.

OLED 10 further includes a bottom cover 16 on the bottom surface of substrate 12. Bottom cover 16 creates a bottom compartment 18 on the bottom side of substrate 12 for containing additional desiccant 24. Because additional desiccant 24 is positioned on the bottom surface of substrate 12, additional desiccant 24 can be provided without obstructing the outward transmission of light from light-emitting element 22, and without needing to enlarge the footprint of OLED 10. Bottom cover 16 can be adapted to be opened or removable (e.g., using mechanical means such as hinges, latches, screw on/off mechanisms, snap on/off mechanisms, etc.). This can allow for replacement of desiccant 24.

Figure 2:
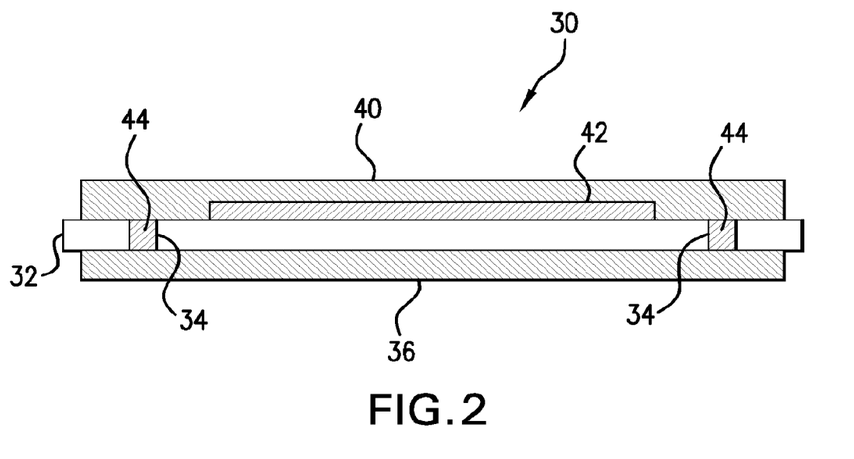
FIG. 2 shows a cross-section side view of an OLED according to another embodiment.

Referring to the embodiment shown in FIG. 2, an OLED 30 (which can be either top-emitting or bottom-emitting) comprises a polymer substrate 32 having a plurality of openings 34 formed through the thickness of substrate 32. An organic light-emitting element 42 is mounted on the top surface of substrate 32. Light-emitting element 42 is covered with a barrier film 40 (which may be transparent if OLED 30 is top-emitting, or may be opaque if OLED 30 is bottom-emitting) that extends over the edges of and encapsulates light-emitting element 42. Barrier film 40 also covers over openings 34.

Because of its polymeric composition, polymer substrate 32 may be permeable to environmental contaminants. To impede the passage of environmental contaminants through substrate 32, the bottom surface of substrate 32 is covered by another barrier film 36 (which may or may not have the same composition as that of barrier film 40). By having desiccant 44 arranged in this manner, desiccant 44 can serve the dual function of impeding the lateral ingress of moisture at both the top and bottom surfaces of substrate 32. In an alternate embodiment, a barrier film also covers over the sides of the device such that the entire device is encapsulated by a barrier film (i.e., barrier film 40 and barrier film 36 are continuous).

Figure 3:
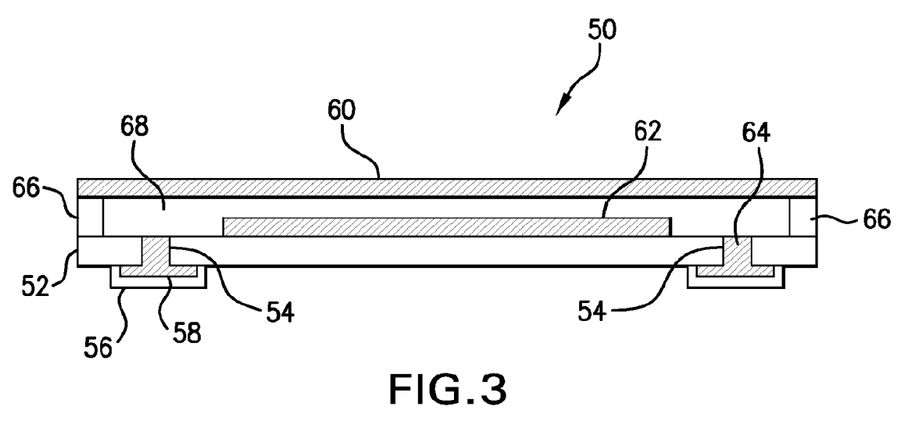
FIG. 3 shows a cross-section side view of an OLED according to another embodiment.

Referring to the embodiment shown in FIG. 3, a top-emitting OLED 50 comprises a substrate 52 having a plurality of openings 54 formed through the thickness of substrate 52. An organic light-emitting element 62 is mounted on the top surface of substrate 52. Openings 54 are filled with a desiccant 64.

Light-emitting element 62 is covered by a transparent glass cover 60, which is sealed at its edges by a sealing adhesive 66 (e.g., a UV-curable liquid adhesive, such as epoxy resin) that bonds glass cover 60 to substrate 52. Thus, light-emitting element 62 is enclosed in a sealed chamber 68. By this arrangement of desiccant 64, moisture that penetrates into sealed chamber 68 can be absorbed by desiccant 64.

OLED 50 further includes a bottom cover 56 on the bottom surface of substrate 52. Bottom cover 56 creates a bottom compartment 58 on the bottom side of substrate 52 for containing additional desiccant 64. Bottom cover 56 can be adapted to be opened or removable to allow for replacement of desiccant 64.

Figure 4:
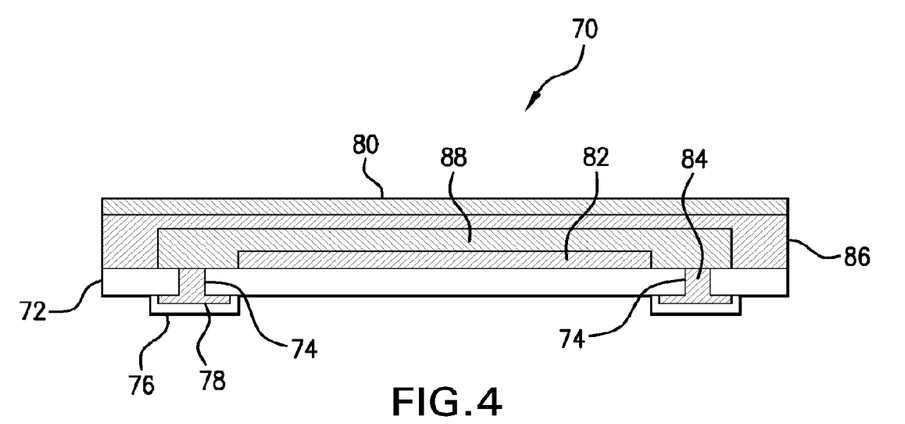
FIG. 4 shows a cross-section side view of an OLED according to another embodiment.

Referring to the embodiment shown in FIG. 4, a top-emitting OLED 70 comprises a substrate 72 having a plurality of openings 74 formed through the thickness of substrate 72. An organic light-emitting element 82 is mounted on the top surface of substrate 72. Light-emitting element 72 is covered with a transparent barrier film 88 that extends over the edges of and encapsulates light-emitting element 82. Barrier film 88 is resistant to the penetration of environmental contaminants, and thereby, serves to protect light-emitting element 82. Barrier film 88 also covers over openings 74. Further, barrier film 88 is provided with a hard, protective cover film 80, which is adhered to barrier film 88 by a layer 86 of lamination adhesive.

Openings 74 are filled with a desiccant 84. By this arrangement of desiccant 84, moisture that penetrates by lateral ingress between barrier film 88 and substrate 72 can be absorbed by desiccant 84 contained in openings 74.

OLED 70 further includes a bottom cover 76 on the bottom surface of substrate 72. Bottom cover 76 creates a bottom compartment 78 on the bottom side of substrate 72 for containing additional desiccant 84. Bottom cover 76 can be adapted to be opened or removable to allow for replacement of desiccant 84.

Figure 5:
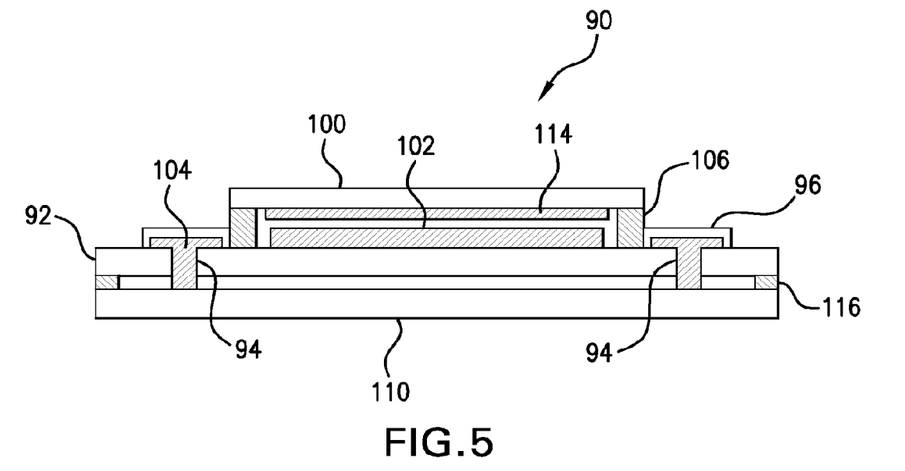
FIG. 5 shows a cross-section side view of an OLED according to another embodiment.

Referring to the embodiment shown in FIG. 5, a bottom-emitting OLED 90 comprises a polymer substrate 92 having a plurality of openings 94 formed through the thickness of polymer substrate 92. An organic light-emitting element 102 is mounted on the top surface of substrate 92. To protect light-emitting element 102 from environmental contaminants, light-emitting element 102 is enclosed in a sealed chamber created by a metal foil cover 100 that is provided over light-emitting element 102 and sealed at the edges by a sealing adhesive 106 that bonds metal foil cover 100 to substrate 92.

Since OLED 90 is a bottom-emitting OLED, polymer substrate 92 is transparent. However, the polymeric material in polymer substrate 92 can become a conduit for the diffusion of environmental contaminants through substrate 92. To impede moisture penetration through the bottom side of substrate 92, the bottom side of substrate 92 is covered with a transparent cover film 110 that serves as a barrier against moisture. Cover film 110 is bonded to the bottom of substrate 92 by adhesive bonds 116.

However, even with these barriers, moisture may still have access routes through the sides or the top surface of substrate 92. To impede moisture penetration through these routes, substrate 92 has a plurality of openings 94 which contain a desiccant 104. By this arrangement of desiccant 104, moisture that penetrates through substrate 92 can be absorbed by desiccant 104.

Furthermore, a gap is maintained between bottom cover film 110 and substrate 92, such that any moisture that penetrates through cover film 110 or laterally through adhesive bonds 116 can circulate within the gap and be absorbed by desiccant 104. Also, desiccant 104 is covered by a cap 96 to contain desiccant 104 within openings 94.

In an alternate embodiment of OLED 90 in FIG. 5, metal foil cover 100 and cap 96 may form a single unitary structure (which can eliminate the need for sealing adhesive 106). Also, a barrier film, such as the one used in OLED 30 of FIG. 2, may be used instead of cover film 110 (which can eliminate the need for adhesive bonds 116).

Figure 6:
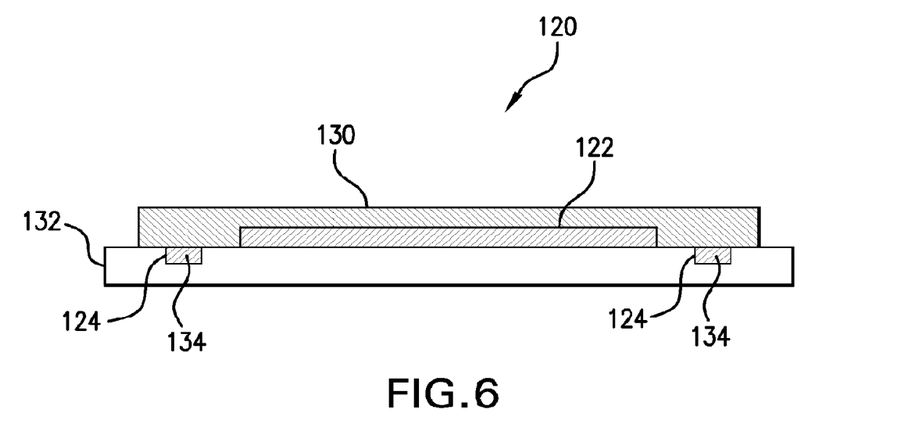
FIG. 6 shows a cross-section side view of an OLED according to another embodiment.

Referring to the embodiment shown in FIG. 6, a top-emitting OLED 120 comprises a substrate 132 having a plurality of pits 124 that penetrate partially through the thickness of substrate 132. An organic light-emitting element 122 is mounted on the top surface of substrate 132. Pits 124 are filled with a desiccant 134. Pits 124 may be formed using any suitable technique. For example, pits 124 may be formed by partially excavating through substrate 132 (e.g., by laser ablation). In another example, pits 124 may be formed by making through-holes in substrate 132, filling the through-holes with desiccant 134, and then plugging the through-holes from the bottom side of substrate 132.

To protect light-emitting element 122 from environmental contaminants, light-emitting element 122 is covered with a barrier film 130 that extends over the edges of and encapsulates light-emitting element 122. Barrier film 130 also covers over pits 124. By this arrangement of desiccant 134, moisture that penetrates by lateral ingress between barrier film 130 and substrate 132 can be absorbed by desiccants 134 contained in pits 124.

In another aspect, the present invention provides an electronic device having a substrate with one or more voids (which may or may not be filled with a desiccant) extending through the thickness of the substrate. The organic element is disposed over the substrate and conformally encapsulated in an environmental barrier. The environmental barrier is also in contact with the substrate and directly on top of the void(s), i.e., it seals over the void(s). The device also has a bottom chamber beneath the substrate with the bottom chamber being in communication with the void(s). The bottom chamber also contains a desiccant to absorb moisture that flows through the void(s) in the substrate.

Figure 7A:
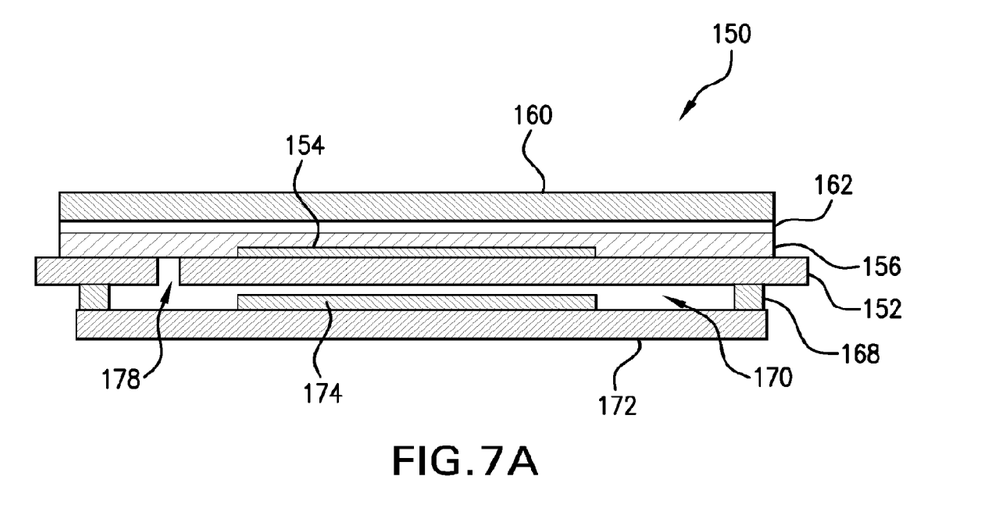
FIG. 7A is a schematic illustration showing a cross-section side view of a prototype that was constructed to demonstrate certain aspects of an embodiment of the invention.

FIG. 7A shows a prototype 150 that was constructed to demonstrate certain aspects of an embodiment of the invention. This prototype 150 was made using a plastic substrate 152. In prototype 150, instead of an organic element, a moisture detecting strip 154 was made on substrate 152 by depositing a 100 nm film of calcium followed by a 5 nm film of indium tin oxide (ITO). This moisture detecting strip 154 serves to indicate the amount of moisture to which an organic element in its place would otherwise be exposed. A through-opening 178 was then cut through plastic substrate 152 to allow the passage of moisture out through the back side of substrate 152. Moisture detecting strip 154 was then encapsulated within a flexible 2 μm barrier film 156 as a moisture barrier. Barrier film 156 had a hybrid silicon oxide/polymer composition and was made in a manner described in U.S. Patent Application Publication No. 2008/0102223 (for application Ser. No. 11/783,361 by Wagner et al, filed 9 Apr. 2007). A hard protective coating 160 was then applied onto barrier film 156 via a laminating adhesive 162.

To form a bottom chamber 170, a cover glass 172 having a desiccant 174 attached thereon was provided. Cover glass 172 was placed over the back side of substrate 152 and sealed with epoxy seals 168 to form bottom chamber 170. The inventors contemplate that the prototype shown in FIG. 7A, with the calcium moisture detecting strip 154 being replaced by an organic element, represents an embodiment of the present invention. A comparative prototype was made in the same manner as above, except that the substrate did not have an opening.

Figure 7B:
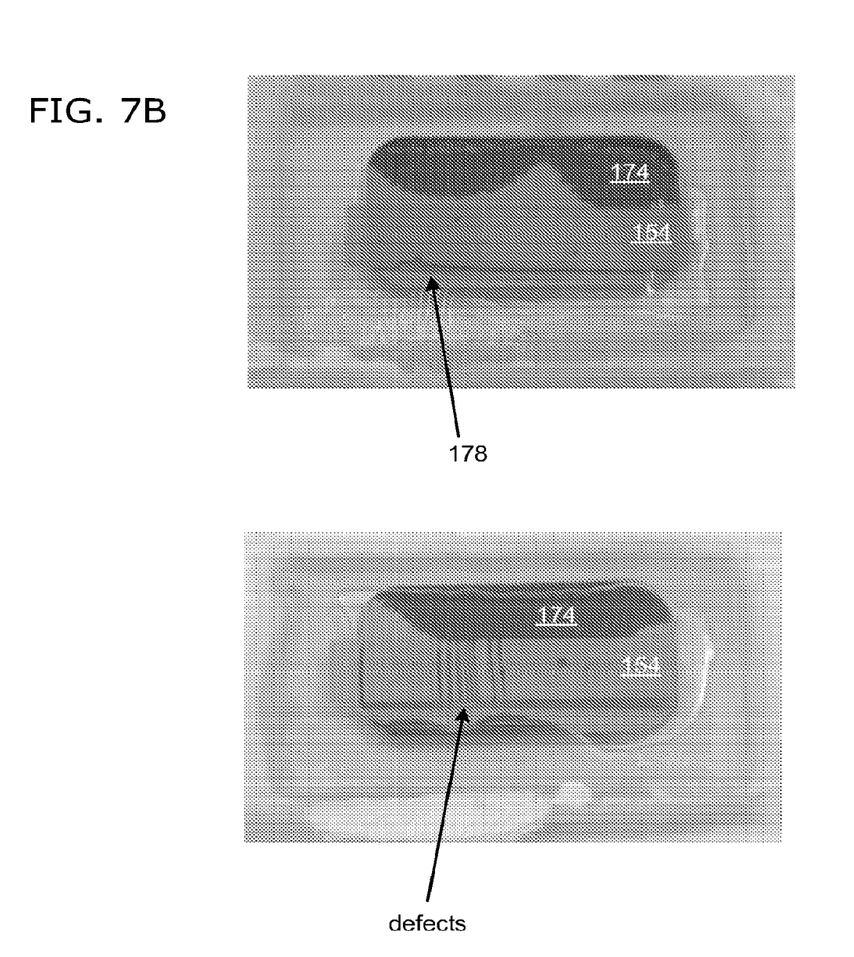
FIG. 7B shows photographs of the prototype, along with a comparative prototype, after 5 days of room air exposure.

FIG. 7B shows photographs of prototype 150 (upper panel) and the comparative prototype (lower panel) after exposure to room air for 5 days. As seen here, prototype 150 having the opening in the substrate has fewer defects in the calcium strip than the comparative prototype without the opening.

Despite the fact that the opening 178 is located away from the moisture detecting strip 154 and completely sealed over by barrier film 156, prototype 150 demonstrated that substantial amounts of moisture that would otherwise contaminate the moisture detecting strip 154 is diverted through the opening 178. The inventors believe that this occurs because moisture penetration through barrier film 156 is primarily by lateral diffusion through the film-substrate interface rather than through the bulk of barrier film 156. Thus, this embodiment may be particularly useful in electronic devices having barrier films in which interface diffusion is the primary mode of moisture diffusion. Diffusion of contaminants into an electronic device can be measured using various techniques. For example, for organic light emitting devices, diffusion can be measured using the technique described in Mandlik et al., Applied Physics Letters, vol. 93:203306 (2008).

In certain electronic device of the present invention, the diffusion coefficient of atmospheric contaminants along the environmental barrier-substrate interface is greater than the diffusion coefficient of atmospheric contaminants through the bulk of the environmental barrier when measured by accelerated storage testing (i.e., at atmospheric conditions of 1 atm, 65° C., and 85% relative humidity). In some cases, the interface diffusion coefficient is more than 4 orders of magnitude greater than the bulk diffusion coefficient. As used herein, "atmospheric contaminants" means materials in the local atmosphere (such as water or oxygen) that are detrimental to the performance of the organic element.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting.

What is claimed is:
1. A method for making an electronic device, comprising:
   (a) providing a substrate having a top surface on one side and a bottom surface on an opposite side, wherein the substrate has a thickness defined by the top surface and the bottom surface;
   (b) creating a plurality of openings in the substrate extending through the thickness of the substrate;
   (c) mounting an organic element directly on the top surface of the substrate;
   (d) disposing an environmental barrier over the organic element, whereby the environmental barrier conformally covers the organic element and wherein the environmental barrier is in contact with the substrate and seals over the openings in the substrate;
   (e) disposing a desiccant in the openings between steps (b) and (c), between steps (c) and (d), or after step (d); and
   (f) providing a cover over the openings on the bottom surface of the substrate, the cover defining an enclosed bottom chamber over the openings, the bottom chamber being in communication with the openings for accommodating additional quantity of the desiccant.

2. An electronic device comprising:
   a substrate having a top surface on one side and a bottom surface on an opposite side, wherein the substrate has a thickness defined by the top surface and the bottom surface;
   an opening extending through the thickness of the substrate;
   an organic element mounted directly on the top surface of the substrate;
   an environmental barrier that conformally covers the organic element and the substrate and encapsulates the organic element between the substrate and the environmental barrier, wherein the environmental barrier is in contact with the substrate and seals over the opening;
   a cover over the opening on the bottom surface of the substrate, the cover defining an enclosed bottom chamber over the bottom surface of the substrate, the bottom chamber being in communication with the opening; and
   a desiccant disposed in the opening in the substrate and in the bottom chamber.

3. The electronic device of claim 2, wherein the diffusion coefficient of atmospheric contaminants along the environmental barrier-substrate interface is greater than the diffusion coefficient of atmospheric contaminants through the bulk of the environmental barrier when measured at atmospheric conditions of 1 atm, 65 C, and 85% relative humidity.

4. The electronic device of claim 3, wherein the interface diffusion coefficient is more than 4 orders of magnitude greater than the bulk diffusion coefficient.

5. The electronic device of claim 2, wherein the cover is adapted to be opened or removed in order to allow for replacement of the desiccant therein.

6. The electronic device of claim 2, wherein the opening is located at a periphery of the organic element.

7. The electronic device of claim 2, wherein the electronic device is an organic light-emitting device comprising an array of organic elements that serve as active pixels, wherein the opening is located at a position to substantially avoid obstructing the transmission of light from the active pixels, and wherein the opening is located between the active pixels.

8. The electronic device of claim 2, wherein the electronic device is a top-emitting organic light-emitting device.

9. The electronic device of claim 2, wherein the electronic device is a bottom-emitting organic light-emitting device.

10. The electronic device of claim 2, wherein the substrate is formed of a metallic material.

11. The electronic device of claim 2, wherein the substrate is formed of a polymeric material.

12. The electronic device of claim 2, wherein the substrate is flexible.

13. The electronic device of claim 2, further comprising a bottom environmental barrier disposed over the bottom surface of the substrate, and wherein a composition of the bottom environmental barrier is the same as or different from the environmental barrier that is disposed over the organic element.

14. An electronic device comprising:
a substrate having a top surface on one side and a bottom surface on an opposite side, wherein the substrate has a thickness defined by the top surface and the bottom surface;
a plurality of openings extending through the thickness of the substrate;
an organic element mounted directly on the top surface of the substrate;
an environmental barrier that conformally covers the organic element and the substrate and encapsulates the organic element between the substrate and the environmental barrier, wherein the environmental barrier is in contact with the substrate and seals over the openings;
a cover over each of the openings on the bottom surface of the substrate, each of the cover defining an enclosed bottom chamber over the corresponding opening, each of the bottom chamber being in communication with the corresponding opening; and
a desiccant disposed in the openings in the substrate.

15. The electronic device of claim 14, wherein the desiccant is disposed in the openings in the substrate and in the respective bottom chambers.

16. The electronic device of claim 14, wherein the cover is adapted to be opened or removed in order to allow for replacement of the desiccant therein.

17. The electronic device of claim 14, wherein the environmental barrier is a flexible film encapsulating the organic element.

18. The electronic device of claim 14, wherein the plurality of openings are located at a periphery of the organic element.

19. The electronic device of claim 14, wherein the electronic device is an organic light-emitting device comprising an array of organic elements that serve as active pixels, wherein the openings are located at positions to substantially avoid obstructing the transmission of light from the active pixels, and wherein the openings are located between the active pixels.

20. The electronic device of claim 14, wherein the electronic device is a top-emitting organic light-emitting device.

21. The electronic device of claim 14, wherein the electronic device is a bottom-emitting organic light-emitting device.

22. The electronic device of claim 14, wherein the substrate is formed of a polymeric material.

23. The electronic device of claim 14, further comprising a bottom environmental barrier disposed over the bottom surface of the substrate, and wherein a composition of the bottom environmental barrier is the same as or different from the environmental barrier that is disposed over the organic element.

* * * * *